(12) United States Patent
Proca et al.

(10) Patent No.: US 9,170,568 B1
(45) Date of Patent: Oct. 27, 2015

(54) FAIL-SAFE STATIC SWITCH

(71) Applicant: Solidstate Controls, LLC, Columbus, OH (US)

(72) Inventors: Amuliu Bogdan Proca, Columbus, OH (US); Philip Irwin, Dublin, OH (US)

(73) Assignee: SOLIDSTATE CONTROLS, LLC, Columbus, OH (US)

( * ) Notice: Subject to any disclaimer, the term of this patent is extended or adjusted under 35 U.S.C. 154(b) by 409 days.

(21) Appl. No.: 13/737,532

(22) Filed: Jan. 9, 2013

Related U.S. Application Data (60) Provisional application No. 61/584,472, filed on Jan. 9, 2012, provisional application No. 61/584,611, filed on Jan. 9, 2012.

(51) Int. Cl.
| | |
|---|---|
| *H02J 9/00* | (2006.01) |
| *G05B 11/01* | (2006.01) |
| *G05B 9/00* | (2006.01) |
| *G05B 1/01* | (2006.01) |
| *H03K 17/94* | (2006.01) |
| *H02J 9/06* | (2006.01) |

(52) U.S. Cl.
CPC ...... *G05B 11/01* (2013.01); *G05B 1/01* (2013.01); *G05B 9/00* (2013.01); *H02J 9/061* (2013.01); *H03K 17/94* (2013.01); *H02J 9/00* (2013.01); *H03K 2217/94* (2013.01); *H03K 2217/94036* (2013.01)

(58) Field of Classification Search
CPC ........... H02J 4/00; H02J 9/00; H02J 9/061; G05B 9/00; G05B 11/01; H03K 2217/94; H03K 2217/94036; H03K 17/94
See application file for complete search history.

(56) References Cited

U.S. PATENT DOCUMENTS

| | | | |
|---|---|---|---|
| 2005/0184592 A1* | 8/2005 | Marwali et al. ......... | H02J 3/005 307/52 |
| 2006/0167569 A1* | 7/2006 | Colombi et al. ........ | H02J 3/005 700/22 |

* cited by examiner

*Primary Examiner* — Daniel Cavallari
(74) *Attorney, Agent, or Firm* — James R. Eley; Michael A. Forhan; Eley Law Firm Co, LPA (57) ABSTRACT

A fail-safe static switch for controlling the supply of redundant electrical power to critical loads. A first control path has a signal analyzer configured to monitor predetermined characteristics of a power supply voltage. The signal analyzer generates a first failure signal when the characteristics of the power supply voltage monitored by the signal analyzer are not in compliance with predetermined metrics. A second control path has a first electrical circuit configured to monitor predetermined characteristics of the power supply voltage. The first electrical circuit generates a second failure signal when the characteristics of the power supply voltage monitored by the first electrical circuit are not in compliance with predetermined metrics. The fail-safe static switch further includes an output providing an electrical output signal. The electrical output signal changes state when at least one of the first failure signal and the second failure signal are generated.

16 Claims, 7 Drawing Sheets

FAIL-SAFE STATIC SWITCH

CROSS-REFERENCE TO RELATED APPLICATIONS

This application claims priority to U.S. provisional patent application No. 61/584,472, filed Jan. 9, 2012, and to U.S. provisional patent application No. 61/584,611, filed Jan. 9, 2012. The entire contents of each of these applications are hereby incorporated herein by reference.

FIELD

The present invention relates generally to a static switch, in particular to a fail-safe static switch for switching between alternate power sources for loads in critical-safety applications.

BACKGROUND

A static transfer switch uses power semiconductors to selectably transfer a load between a plurality of power sources. Because there are no mechanical moving parts, the transfer can be completed rapidly. Static transfer switches are often used where a reliable and independent second source of power is available and it is necessary to protect the load from even a few alternating current (AC) power frequency cycles of interruption time in a primary power source, and from any voltage surges or sags in the primary power source. An example of such critical loads is electrical equipment and systems that are essential to emergency reactor shutdown in nuclear power-generating facilities, defined as "Class 1E" by the Institute of Electrical and Electronics Engineers (IEEE). Such electrical equipment and systems must meet certain predetermined seismic, aging and mechanical vibration standards.

There has been a gradual adoption of digital Uninterruptible Power Supply (UPS) systems by industries that utilize secure power equipment. With this transformation has followed constant refining and development of electronic components, strategies and topologies for the UPS systems. Using this approach for UPS systems, leveraging modern technologies such as Digital Signal Processing (DSP) microprocessors, can lead to higher power-to-volume ratios, tighter control of power supply waveform and power quality, higher system efficiencies, and significant cost advantages. However, the North American nuclear industry, using UPS systems in Class 1E applications, has justifiably and understandably been hesitant to adopt such changes in design approach for critical-safety UPS systems until sufficient stability, maturity and quantifiable reliability has been attained. Despite this hesitation, increasing maturity of digital UPS systems coupled with older component obsolescence is causing North American nuclear engineering teams to re-think secure power solutions and embrace digital UPS designs.

Before adopting the newer digital UPS technology for Class 1E applications, there are key areas where significant in-depth review, evaluation and analysis are required. This is necessary to ensure that the foundation blocks of safety, reliability and ruggedness that are synonymous with, for example, North American nuclear installations, are maintained. Key areas such as software and firmware are of particular interest for UPS installations where the equipment typically comprises hard-wired componentry employing analog control techniques in power electronics. This results in a dichotomy for agencies and operators alike: how best to leverage the advantages of older, proven hardware with its legacy and proven track record, with new digital techniques where cost, efficiency and space provide a number of advantages.

A drawback of current Class 1E UPS systems is that experience is limited using DSP controlled systems. Of course, there are processes and tools that can be used in development and qualification testing that may mitigate much of the risk. However, when addressing the key area of static switch design and control, with a single point of common coupling on the AC power output, there is logically a point of potential common-cause failure.

Modern implementations of static switches typically consist of matched pairs of inversely mounted silicon-controlled rectifiers (SCRs) for each phase of the inverter and the bypass. The transfers between the inverter and static switch are dictated by load and operating conditions. Most conventional UPS systems use one of the following approaches:

(a) Fully analog systems that detect the lack of output voltage of the output through a series of comparators, such as the SE/SS line of ferro-resonant systems available from Ametek Solidstate Controls of Columbus, Ohio (hereafter "Ametek");

(b) Fully digital systems that use analog/digital converters and software to determine when to transfer; and (c) Hybrid systems that use comparators to generate pulses representative of voltage failures and software to determine the transfer sequence.

However, it is important to insure that in case of any failure of the UPS, be it digital or analog, hardware or software, the load is transferred safely and reliably to an alternate ("bypass") power source.

SUMMARY

The disclosed invention is a combination of hardware and software to ensure a failsafe operation. To minimize the risk of single-point failures, the disclosed invention utilizes several independent paths for failure detection, comprising both software and hardware. Any of the paths are able to transfer between a primary power source to a bypass power source to provide power to a load, independently of one another.

In one embodiment of the present invention a fail-safe static switch controls the supply of redundant electrical power to critical loads. A first control path has a signal analyzer forming a first electrical circuit configured to monitor predetermined characteristics of a power supply voltage. The signal analyzer generates a first failure signal when the characteristics of the power supply voltage monitored by the signal analyzer are not in compliance with predetermined metrics. A second control path has a second electrical circuit configured to monitor predetermined characteristics of the power supply voltage. The second electrical circuit generates a second failure signal when the characteristics of the power supply voltage monitored by the second electrical circuit are not in compliance with predetermined metrics. The fail-safe static switch further includes an output providing an electrical output signal. The electrical output signal changes state when at least one of the first failure signal and the second failure signal are generated.

BRIEF DESCRIPTION OF THE DRAWINGS

Further features of the inventive embodiments will become apparent to those skilled in the art to which the embodiments relate from reading the specification and claims with reference to the accompanying drawings, in which:

DETAILED DESCRIPTION

Figure 1:
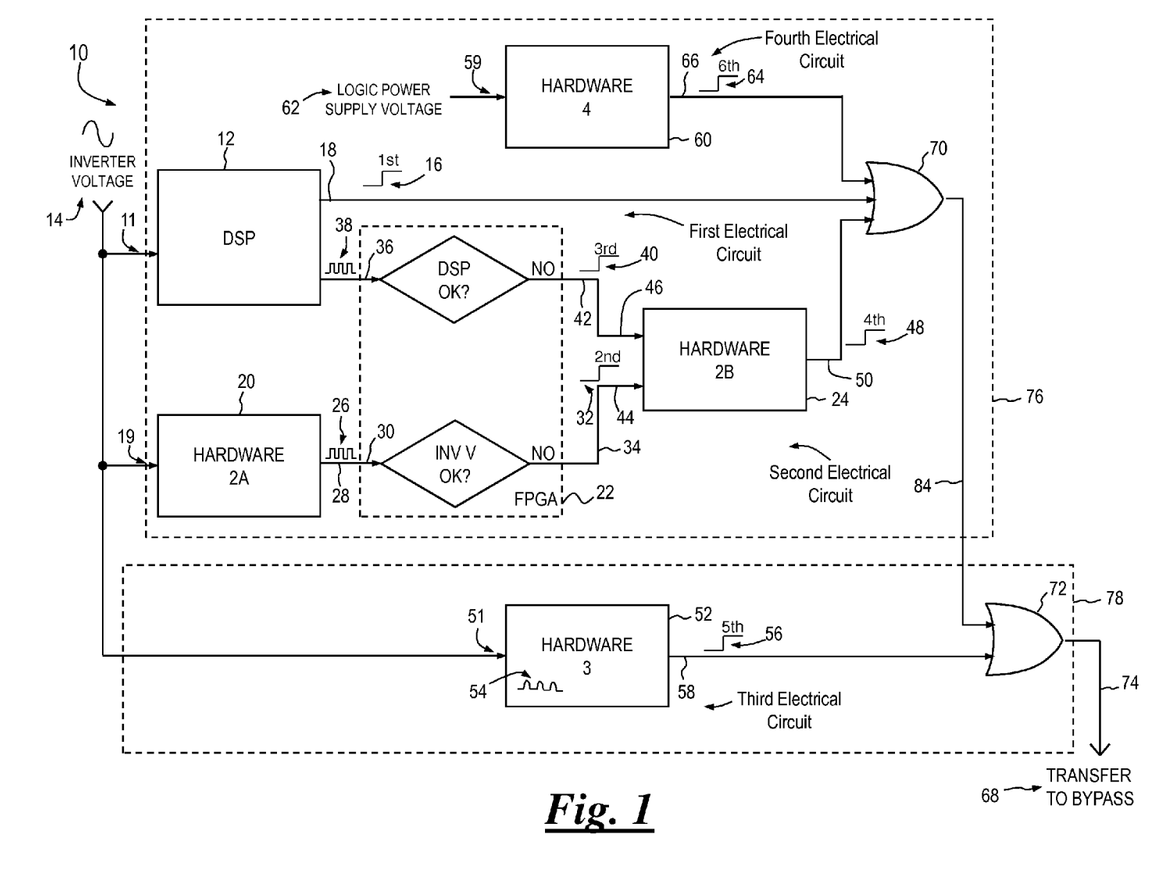
FIG. 1 is a schematic block diagram of a fail-safe static switch according to an embodiment of the present invention.

A schematic block diagram of a fail-safe static switch 10 is shown in FIG. 1 according to an embodiment of the present invention. A first control path 11 comprises a signal analyzer which in some embodiments may be a digital signal processor ("DSP") 12 which forms a first electrical circuit. Measurements of a power supply voltage 14 generated by a voltage inverter of a not-shown UPS are analyzed by DSP 12 to ensure that predetermined power characteristics (e.g., voltage amplitude, waveshape, symmetry, etc.) are maintained. DSP 12 generates a first failure signal 16 at an output 18 of the DSP if a fault condition (i.e., a measured characteristic of supply voltage 14 that is not within compliance with predetermined metrics) is detected by the DSP. The generated first failure signal 16 may change state in any predetermined manner such as, without limitation, a voltage level, logical state, pulse width, frequency, etc. to indicate the presence of a fault.

A second control path comprises a functional block 20 representing an electrical circuit labeled Hardware 2A, a Field-Programmable Gate Array (FPGA) integrated circuit 22 and a functional block 24 representing an electrical circuit labeled Hardware 2B. Inverter AC supply voltage 14 is converted by Hardware 2A block 20 to a series of pulses 26, the pulses being coupled from an output 28 of Hardware 2A block to a first input 30 of FPGA 22. FPGA block 22 measures pulses 26 for conformance to predetermined criteria (e.g., pulse width, amplitude, frequency, duty cycle, patterns, etc.). FPGA block 22 generates a second failure signal 32 at a first output 34 if a fault condition (i.e., a measured characteristic of pulses 26 that is not within compliance with predetermined metrics, indicating a fault inverter supply voltage 14) is detected by the FPGA. The generated second failure signal 32 may change state in any predetermined manner such as, without limitation, a voltage level, logical state, frequency, etc. to indicate the presence of a fault.

FPGA block 22 also monitors the operational status of DSP 12 by monitoring for predetermined operating characteristics of the DSP. In one embodiment, FPGA 22 receives at a second input 36 a monitoring signal 38 from DSP 12 and measures the monitoring signal for conformance to predetermined operating characteristics (e.g., timing, patterns, frequency, duty cycle, etc.). As a non-limiting example, monitoring signal 38 may comprise certain signals normally generated by DSP 12 when accessing a program memory element at a predetermined memory location. FPGA 22 generates a third failure signal 40 at a second output 42 if a fault condition (i.e., a measured operating characteristic of DSP 12 not in compliance with predetermined metrics) is detected by the FPGA. The generated third failure signal 40 may change state in any predetermined manner such as, without limitation, a voltage level, logical state, frequency, etc. to indicate the presence of a fault.

Hardware 2B block 24 monitors for second and third failure signals 32, 40 respectively at first and second inputs 44, 46 respectively of the Hardware 2B block and, if either failure signal is detected, generates a fourth failure signal 48 at an output 50. In some embodiments Hardware 2B block 24 may also be configured to monitor the status of FPGA 22 and generate fourth failure signal 48 if a predetermined fault condition (i.e., a measured characteristic of FPGA 22 not in compliance with predetermined metrics) is detected by the Hardware 2B block. The generated fourth failure signal 48 may change state in any predetermined manner such as, without limitation, a voltage level, logical state, frequency, etc. to indicate the presence of a fault. In one embodiment of static switch 10, the second control path 19 includes a second electrical circuit having Hardware 2A block 20, FPGA 22 and Hardware 2B block 24.

Outputs 34, 42 may be separate as shown in FIG. 1, or may be tied together or logically ORed internal or external to FPGA 22. Likewise, inputs 44, 46 may be separate as shown in FIG. 1, or may be tied together or logically ORed internal or external to Hardware 2B block 24.

A third control path 51 is a block 52 representing a third electrical circuit labeled Hardware 3. This path is preferably an analog path, similar to those used in connection with analog Ferro-resonant UPS systems used in Class 1E applications. Inverter supply voltage 14 is rectified by Hardware 3 block 52 and converted to pulses 54. Hardware 3 block 52 measures predetermined characteristics of pulses 54 for conformance to predetermined criteria (e.g., pulse width, amplitude, frequency, duty cycle, patterns, etc.). Hardware 3 block 46 generates a fifth failure signal 56 at an output 58 if the Hardware 3 block detects a fault condition (i.e., a measured characteristic of inverter supply 14 not in compliance with predetermined metrics). The generated fifth failure signal 56 may change state in any predetermined manner such as, without limitation, a voltage level, logical state, frequency, etc. to indicate the presence of a fault.

A fourth control path 59 comprises a block 60 representing a fourth electrical circuit labeled Hardware 4 that monitors predetermined characteristics (e.g., voltage, etc.) of a logic power supply voltage 62 for static switch 10. Hardware 4 block 60 generates a sixth failure signal 64 at an output 66 if the Hardware 4 block detects a fault condition (i.e., a measured characteristic of logic supply voltage 62 not in compliance with predetermined metrics). The generated sixth failure signal 64 may change state in any predetermined manner such as, without limitation, a voltage level, logical state, frequency, etc. to indicate the presence of a fault.

Ultimately, first, second, third, fourth, fifth and sixth failure signals 16, 32, 40, 48, 56, 64 respectively are logically ORed such that an indication of a fault condition in one or more of the failure signals results in the generation of a bypass transfer signal 68. Bypass transfer signal 68 is preferably an electrical signal that changes state. Bypass transfer signal 68 may change state in any suitable manner such as, without limitation, from a logic "1" to a logic "0" or vice versa, voltage, frequency, etc.

In the embodiment of FIG. 1 a first logical OR gate 70 and a second logical OR gate 72 represent this configuration. However, one skilled in the art will appreciate that gates 70, 72 may be realized in any suitable manner such as, without limitation, placing a diode in series with each failure signal line with the anode of each diodes coupled to a corresponding failure signal line and the cathodes of all of the diodes coupled together to form an output 74 for bypass transfer signal 68.

From the foregoing discussion it can be seen that bypass transfer signal 68 is generated when one or more of first, second, third, fourth, fifth and sixth failure signals 16, 32, 40, 48, 56, 64 present and detected by the switch 10 circuitry. Bypass transfer signal is preferably coupled to suitable switching circuitry to transfer a select load (or loads) from the UPS to a secondary bypass power source, thereby maintaining power to the load in the event of a fault in the UPS.

Although the foregoing discussion utilizes positive logic (i.e., changing from a low logic state to a high logic state) for the purpose of illustration, preferably at least bypass transfer signal 68 is implemented in reverse logic wherein a transition from a logic "1" to a logic "0" causes the aforementioned switching circuitry to transfer the load from the UPS to a bypass power source. Any or all of first, second, third, fourth, fifth and sixth failure signals 16, 32, 40, 48, 56, 64 may likewise be implemented in reverse logic. Thus, in the event of a failure (such as a voltage failure, broken wire, etc.) the system will transfer to the "bypass" state.

As can be seen from the foregoing, recognizing the critical importance of the static switch circuitry, the present invention does not rely on a single failure detection mode.

With reference again to FIG. 1, in one example embodiment static switch 10 may comprise two assemblies. An inverter/static switch controller assembly 76 contains all elements converging to first OR gate 70 in the block diagram. A static switch gate drive assembly 78 includes the analog path of Hardware 4 block 52 and second OR gate 72.

Figure 2:
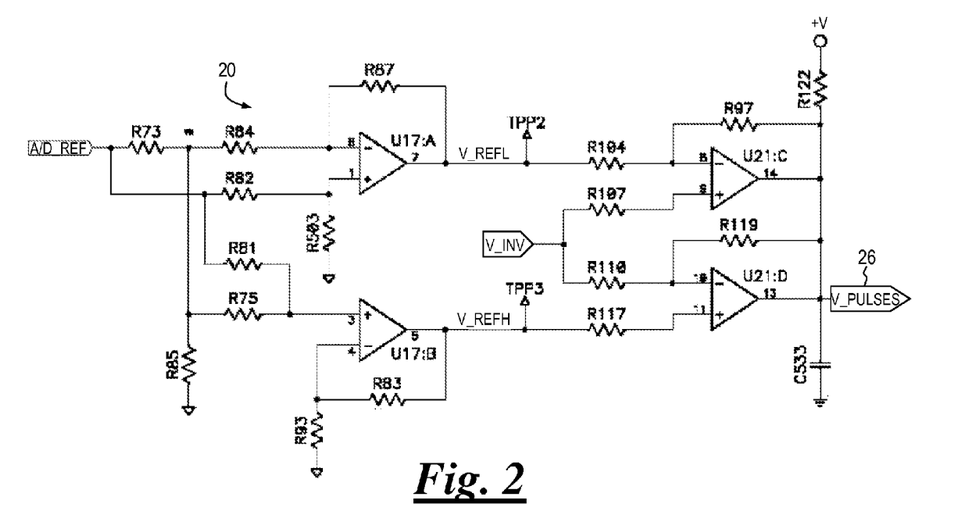
FIG. 2 is a schematic diagram of an example circuit representation of a "Hardware 2A" portion of the block diagram of FIG. 1 according to an embodiment of the present invention.
Figure 3:
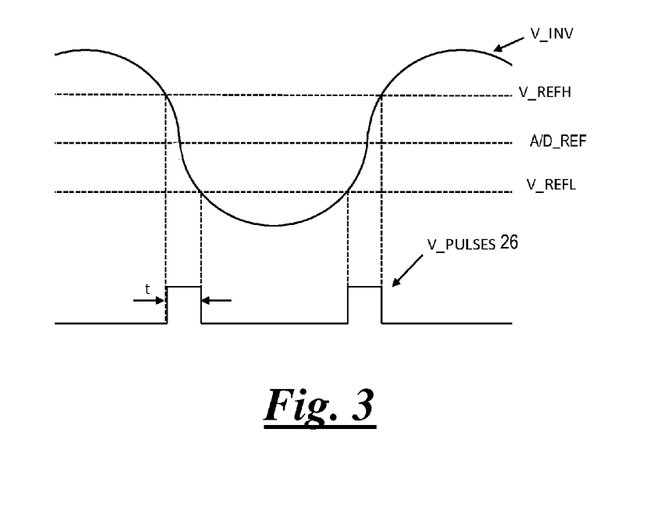
FIG. 3 shows example waveform diagrams of electrical signals that may be generated by the electronic circuit of FIG. 2.

FIG. 2 is a non-limiting example implementation of Hardware 2A block 20 of FIG. 1. A pair of comparators U17:A and U17:B generate two voltage references V_REFL and V_REFH respectively, symmetrically spaced around a midpoint voltage A/D_REF of the conversion range of an analog-to-digital (A/D) converter of DSP 12. A reference voltage, V_INV, is a scaled down version of the inverter voltage, offset by A/D_REF. V_INV is compared to V_REFL and V_REFH in a second pair of comparators, U21:C and U21:D having open-collector outputs. If the V_INV voltage is higher than V_REFH or lower than V_REFL, the collector of the respective comparator U21:C and U21:D will turn on, pulling an output signal V_PULSES (i.e., pulses 26 of FIG. 1) to a low (logical "0") state. When V_INV is in between the V_REFH and V_REFL voltage levels, the outputs of comparators U21:C and U21:D will be off (open), generating pulses 26. FIG. 3 is a representation of the main signals generated by Hardware 2A block. V_PULSES 26 in FIG. 3 represents the output of comparators U21:C and U21:D.

Figure 4:
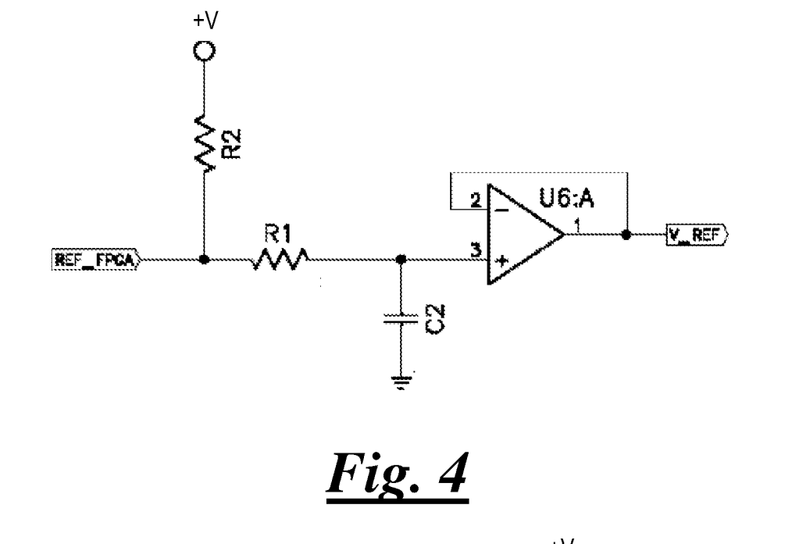
FIG. 4 is a schematic diagram of an example circuit representation of a low pass filter according to an embodiment of the present invention.
Figure 5:
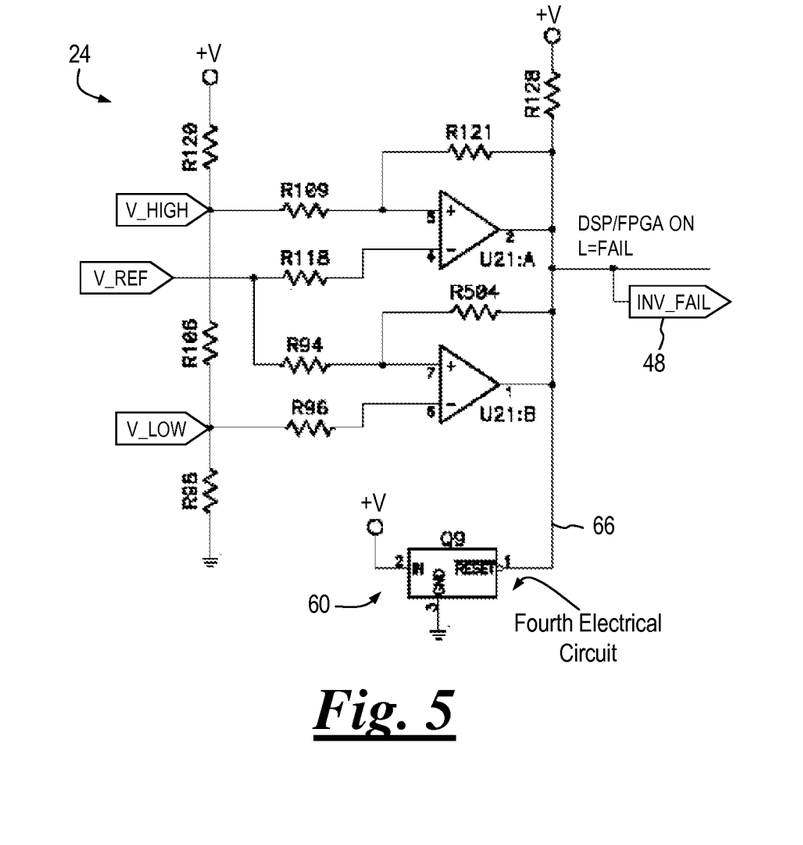
FIG. 5 is a schematic diagram of an example circuit representation of a "Hardware 2B" portion of the block diagram of FIG. 1 according to an embodiment of the present invention.
Figure 6:
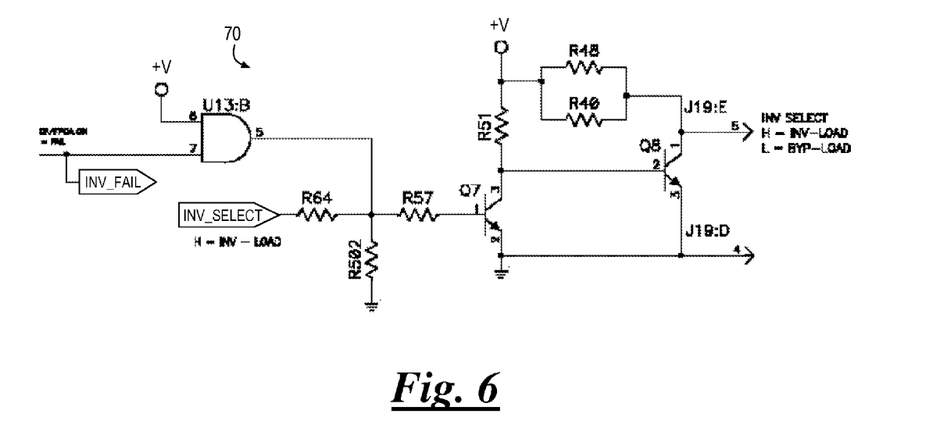
FIG. 6 is a schematic diagram of an example circuit representation of a first logical OR block portion of the block diagram of FIG. 1 according to an embodiment of the present invention.

FIGS. 4, 5 and 6 are example electronic schematic circuit diagrams that correspond to Hardware 2B Block 24 of FIG. 1.

REF_FPGA is a clock-based square wave signal generated within FPGA 22. This signal is an AND function of the following statements:

(A) The width of pulses V_PULSES (FIG. 2) is less than a predetermined value such as, but not limited to, about 4 ms;
(B) DSP 12 is operational; and
(C) FPGA 22 is operational.

If any of statements (A) and (B) are false, the REF_FPGA signal will be forced to a low state. If statement (C) is false (e.g., FPGA 22 is damaged, reset or halted), the REF_FPGA signal will be in either high or low state (logical "1" or logical "0"), but not oscillating. The REF_FPGA signal preferably passes through a low pass filter, such as the example filter of FIG. 4, resulting in the V_REF signal of FIG. 2.

Under normal operating conditions of switch 10, V_REF is a DC signal with a predetermined average value. The example circuit of FIG. 5 includes a pair of comparators U21:A and U21:B having open-collector outputs. Comparators U21:A and U21:B compare the V_REF signal with a low voltage reference V_LOW and a high voltage reference V_HIGH. As long as V_REF is between the two voltage references, the outputs of the comparators U21:A and U21:B are open (i.e., the output collectors are non-conducting). An output signal of the circuit of FIG. 5, INV_FAIL (signal 48 of FIG. 1), is pulled to a high state (logic "1") by a resistor R128 if neither of comparators U21:A and U21:B pull it to a low state (logic "0"). If V_REF is outside of its band, established by the two aforementioned reference voltages, the output of the respective comparator U21:A and U21:B will pull the INV_FAIL signal to a low state (logic "0").

FPGA 22 may also monitor the status of DSP 12 (signal 40 of FIG. 1) and the width of the pulses (26 of FIG. 1) that represent the inverter voltage 14. If both are normal, V_REF is at a predetermined value and Hardware 2B block 24 takes no action. If either of these conditions is violated, V_REF changes to a low state (logic "0"), pulls INV_FAIL to a low state (logic "0") and forces a transfer the state of signal 68 to signal a bypass, causing the bypass transfer signal 68 (FIG. 1) to command a switch of the load to the bypass power source. Additionally, this function also accomplishes the role of an FPGA monitor. If FPGA 22 does not operate properly (i.e., reset, locked, damaged etc), V_REF moves outside of the limits of V_LOW and V_HIGH, forcing the INV_FAIL signal to a low state (logic "0").

An example implementation of Hardware 4 block 60 of FIG. 1 is represented by circuit Q9 of FIG. 5. Q9 is a power supply monitor. If a select voltage input (+V) supplied to Q9 is unstable or too low, a $\overline{\text{RESET}}$ output of Q9 is activated into a conducting low state (logic "0"). The $\overline{\text{RESET}}$ output of Q9 is coupled to the INV_FAIL line such that the logic "0" state of the RESET output forces the INV_FAIL signal low, causing the bypass transfer signal 68 (FIG. 1) to command a switch of the load to the bypass power source.

The first OR gate 70 in the block diagram of FIG. 1 may implemented as shown in the example circuit of FIG. 6. Under normal operating conditions of switch 10, the decision to transfer to a bypass secondary power source or UPS inverter depends only on the state of DSP 12 (through R64). INV_FAIL is the connecting point of all the protection signals previously described. It connects to an input of AND gate U13:B (used here as a buffer). The INV_FAIL signal is normally pulled to a logical high state (logic "1") by R128 (FIG. 5). While the INV_FAIL signal is in a high state (logic "1"), indicating everything else normal, DSP 12 can command a transfer to bypass/inverter through the signal INV_SELECT. If INV_FAIL is pulled low by any of the circuits that are connected together (i.e., a logical OR), a transfer to bypass signal 68 is forced regardless of the status of the INV_SELECT signal. This insures that any of the aforementioned protection paths are able to generate a transfer to bypass signal 68 even if the others have failed.

Figure 7:
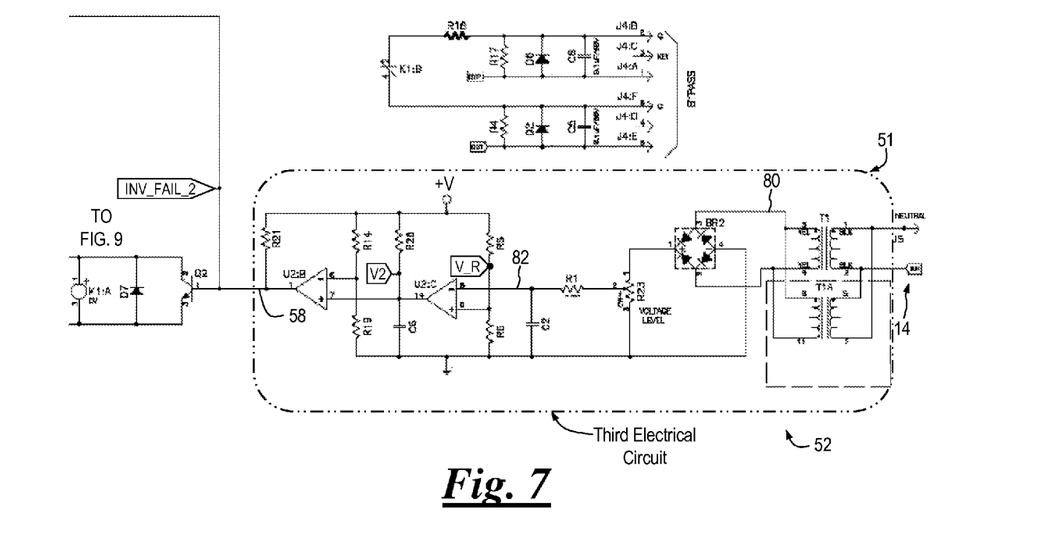
FIG. 7 is a schematic diagram of an example circuit representation of a "Hardware 3" portion of the block diagram of FIG. 1 according to an embodiment of the present invention.
Figure 8:
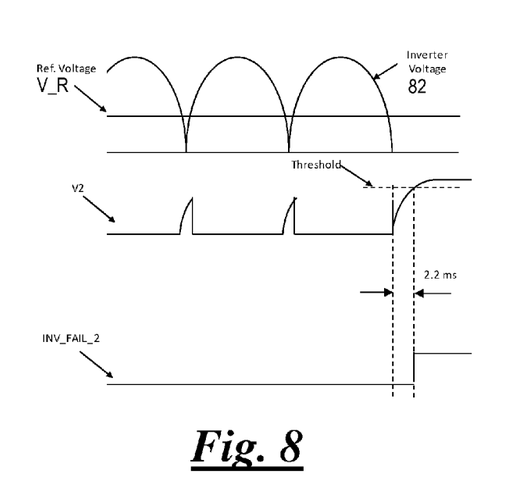
FIG. 8 shows example waveform diagrams of electrical signals that may be generated by the electronic circuit of FIG. 7.

Hardware 3 block 52 and second OR gate 72 of FIG. 1 may be located on the static switch gate drive assembly 78, and are preferably analog circuits similar to those used in Class 1E applications. FIG. 7 is a schematic of a portion of an example circuit of Hardware 3 block 52, while FIG. 8 is a representation of the waveforms of the circuit. A scaled version 80 of the inverter voltage 14 is rectified by a rectifier assembly BR2 to form a voltage 82. Voltage 82 is compared to a reference voltage V_R by a comparator U2:C. When voltage 82 falls below the reference voltage V_R (e.g., inverter voltage approaches zero crossing), comparator U2:C turns high (i.e., open collector) and capacitor C6 begins charging through a resistor R20 (signal V2). However, if the voltage 82 does not rise above the reference voltage V_R, as in the case of an inverter failure) voltage V2 continues to rise. If the voltage of V2 exceeds a threshold voltage established though a voltage divider R14/R19, a comparator U2:B switches to a high state (i.e., open collector) and turns ON transistor Q2 and forces a transfer to bypass signal 68.

Figure 9:
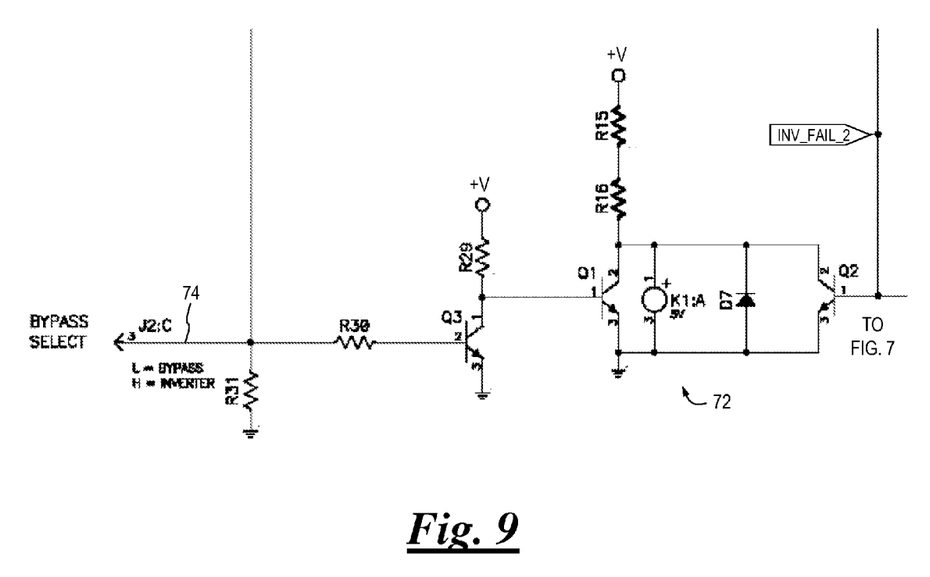
FIG. 9 is a schematic diagram of an example circuit representation of a second logical OR block portion of the block diagram of FIG. 1.

FIG. 9 is an example schematic of the second OR gate 72 of FIG. 1. The transfer to bypass signal 68 is accomplished by shorting reed relay K1 in the figure. This can be accomplished by either turning ON transistor Q1 or Q2 (OR function). The path corresponding to transistor Q1 is a digital path 84 shown in FIG. 1 (DSP 12, FPGA 22) from the inverter/static switch controller 76. The path of transistor Q2 preferably comprises analog components and is completely independent of the first path. This insures that, in the event of an inverter failure, even if there is a failure in one path, there is redundant circuitry to generate a transfer to bypass signal 68.

Figure 10:
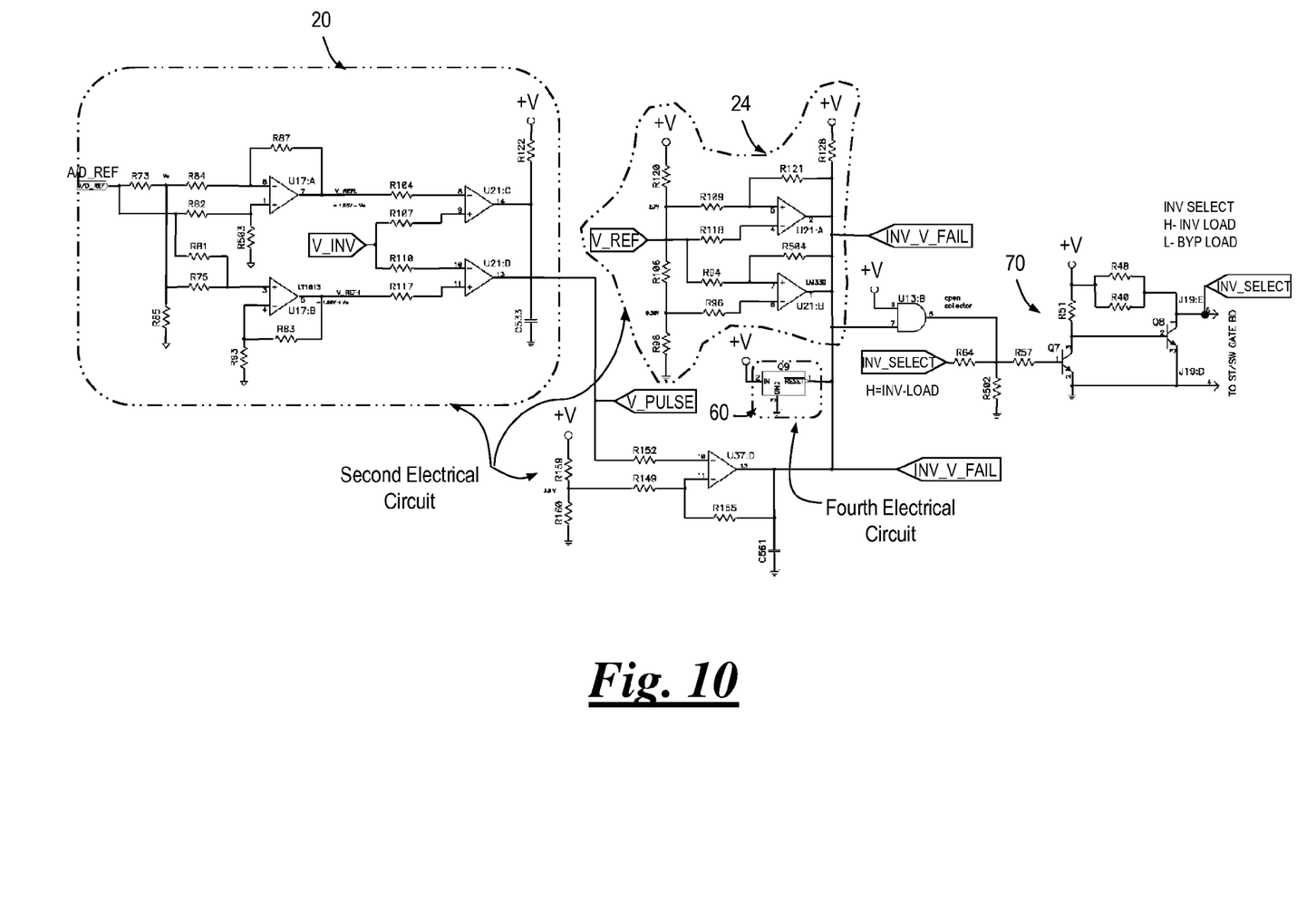
FIG. 10 is a schematic diagram showing the interconnection of the circuits of FIGS. 2, 5 and 6 according to an embodiment of the present invention.
Figure 11:
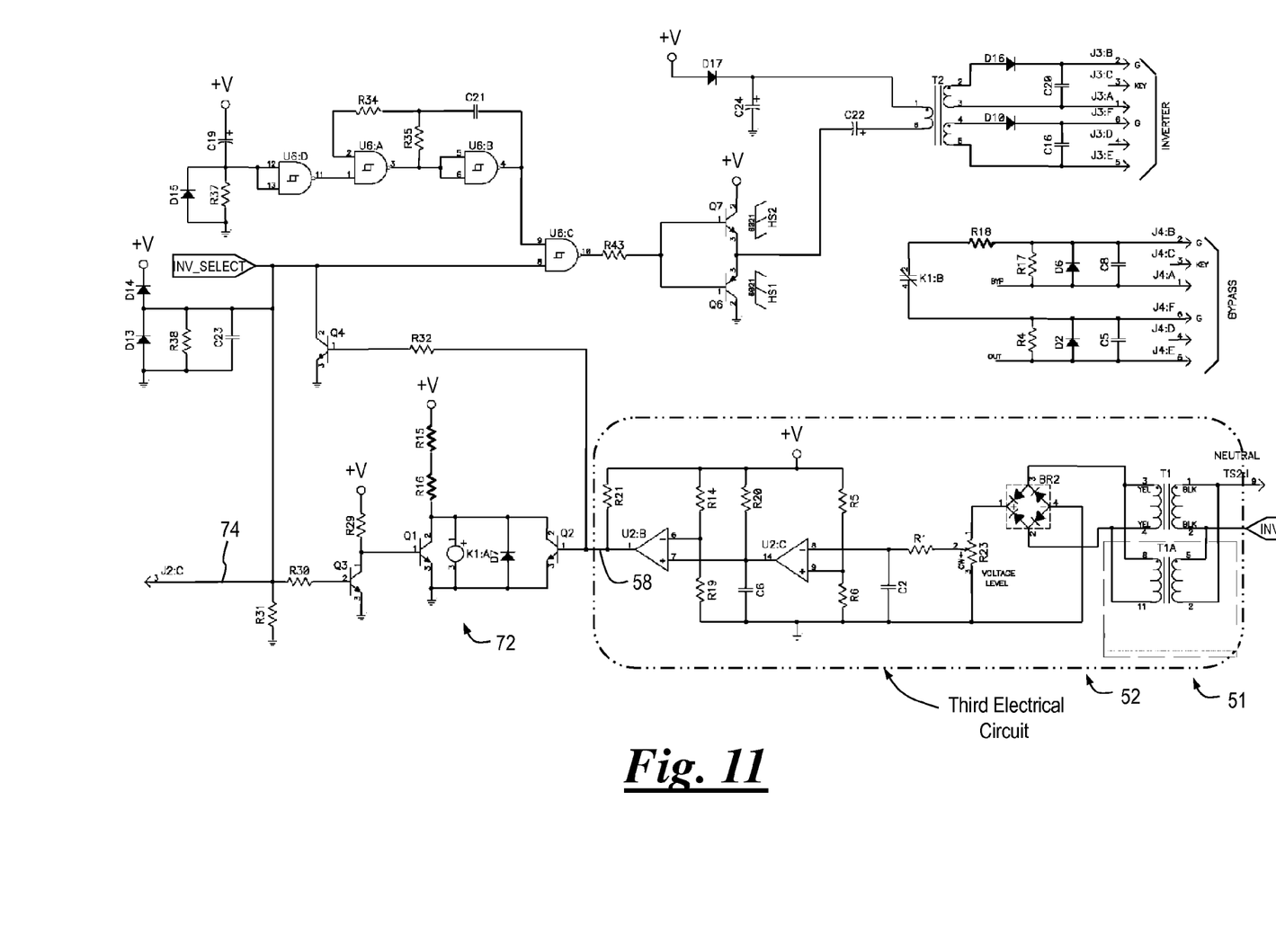
FIG. 11 is a schematic diagram showing the interconnection of the circuits of FIGS. 7 and 9 according to an embodiment of the present invention.

FIG. 10 is a schematic diagram showing the interconnection of the circuits of FIGS. 2, 5 and 6, while FIG. 11 is a schematic diagram showing the interconnection of the circuits of FIGS. 7 and 9.

Preferably, reed relays are utilized for the bypass gate drive (K1 in the schematic of FIGS. 7 and 9). This ensures that, even if power is lost to the gate drive assembly 78, bypass silicon controlled rectifiers (SCRs) of the gate drive assembly will self-gate, allowing the load to be transferred to bypass.

With reference again to FIG. 1, the following are a series of tests that may be used to verify proper operation of a system constructed in accordance with the present invention:

(1) Verify that the main switching function of static switch 10 is performed: under normal system operating conditions, the inverter supplying inverter voltage 14 is turned off. The static switch 10 should transfer to bypass by generating a bypass transfer signal 68.

(2) Simulate a failure in the digital path (between the controller assembly 76 and the static switch gate drive assembly 78). Insert a test switch in series with the Bypass select line 74. With the inverter running and on inverter to load, turn off (i.e., open-circuit) the test switch, simulating a broken wire. The load should be automatically transferred to bypass by generating a bypass transfer signal 68.

(3) Fail power to static switch gate drive assembly 78 by inserting a test switch in series with an appropriate +V line from controller to gate drive. With the inverter running and on inverter to load, turn off (i.e., open-circuit) the test switch, simulating a broken wire. The load should be automatically transferred to bypass by generating a bypass transfer signal 68.

(4) Fail entire digital path (at the last transistor). Connect a test switch between pins 1 and 3 of transistor Q3 (FIG. 9). With the inverter connected to load, close the test switch; this will prevent the digital path from transferring to bypass. Turn off the inverter supplying inverter voltage 14. The unit should transfer to bypass. This verifies that, although the controller 76 has lost its capability of transferring to bypass, the analog path of gate drive 78 performed the transfer.

(5) Fail analog path. Connect a test switch in series with pin 2 of transistor Q2. With the inverter connected to load, open (i.e., open-circuit) the test switch; this will prevent the analog path to transfer to bypass. Turn off the inverter supplying inverter voltage 14. The unit should transfer to bypass. This verifies that, although the analog path has lost its capability of transferring to bypass, the digital path 84 performed the transfer.

It is important to note that, although the present invention provides high redundancy in terms of its control path, there remains a potential single point of failure in the reed relay K1. If the reed relay K1 remains "stuck" in the open position, the static switch 10 will not be able to transfer to bypass. However, there is a long service history of using the this type of relay in similar applications (i.e., static switch gate drive) in Class 1E systems, thereby providing assurance that such relays will operate satisfactorily in connection with the present invention as well.

As may be appreciated from the foregoing discussion, the present invention provides a highly-reliable static switch control for use in Class 1E applications.

The disclosed implementation for static switch control is a combination of digital and analog circuitry that provides the advantages of both while avoiding their individual shortcomings. The present invention provides two independent control paths, one mixed analog/digital and one analog only, that can each independently switch the load to the safe bypass source in case of an inverter failure.

In various embodiments of static switch 10 may be realized using any suitable discrete or integrated analog and/or digital components, software and firmware within the scope of the invention. For example, FPGA 22 may be realized utilizing discrete components, a microcontroller, and a microprocessor, among others.

While this invention has been shown and described with respect to a detailed embodiment thereof, it will be understood by those skilled in the art that changes in form and detail thereof may be made without departing from the scope of the claims of the invention. For example, although the foregoing discussion is directed to the use of the present invention in connection with an uninterruptable power supply, one skilled in the art will appreciate that the present invention may be used to advantage for fail-safe switching between any plurality of power sources for a load (or loads).

What is claimed is:
1. A fail-safe static switch, comprising:
a first control path having a signal analyzer forming a first electrical circuit, the signal analyzer being configured to monitor predetermined characteristics of a power supply voltage, the signal analyzer generating a first failure signal when the characteristics of the power supply voltage monitored by the signal analyzer are not in compliance with predetermined metrics;
a second control path having a second electrical circuit, the second electrical circuit being configured to monitor predetermined characteristics of the power supply voltage, the second electrical circuit generating a second failure signal when the characteristics of the power supply voltage monitored by the second electrical circuit are not in compliance with predetermined metrics; and
an output providing an electrical output signal, wherein the electrical output signal changes state when at least one of the first failure signal and the second failure signal are generated.

2. The fail-safe static switch of claim 1 wherein the first failure signal and the second failure signal are independent of one another.

3. The fail-safe static switch of claim 1 wherein the second electrical circuit includes a first portion configured to generate pulses corresponding to the predetermined characteristics of the power supply voltage, and a second portion configured to compare the pulses to the predetermined metrics of the power supply voltage.

4. The fail-safe static switch of claim 3 wherein the second electrical circuit further includes a third portion configured to monitor predetermined characteristics of the signal analyzer,
the third portion generating a third failure signal when the characteristics of the signal analyzer monitored by the second electrical circuit are not in compliance with predetermined metrics, and
the electrical output signal changes state when at least one of the first failure signal, the second failure signal and the third failure signal are generated.

5. The fail-safe static switch of claim 4 wherein the first, second and third failure signals are each independent of one another.

6. The fail-safe switch of claim 4 wherein the second electrical circuit further includes a fourth portion configured to receive the second and third failure signals,
the fourth portion generating a fourth failure signal when at least one of the second failure signal and the third failure signal are generated, wherein
the electrical output signal changes state when at least one of the first failure signal, the second failure signal, the third failure signal and the fourth failure signal are generated.

7. The fail-safe switch of claim 6 wherein the second and third portions are implemented in an integrated circuit.

8. The fail-safe switch of claim 7 wherein the integrated circuit is a field programmable gate array.

9. The fail-safe switch of claim 7 wherein the fourth portion is configured to monitor predetermined characteristics of the integrated circuit, the fourth portion additionally generating the fourth failure signal when the characteristics of the integrated circuit monitored by the fourth portion are not in compliance with predetermined metrics.

10. The fail-safe switch of claim 1, further including a third control path, the third control path having a third electrical circuit,
the third electrical circuit being configured to monitor predetermined characteristics of the power supply voltage,
the third electrical circuit generating a fifth failure signal when the characteristics of the power supply voltage monitored by the third electrical circuit are not in compliance with predetermined metrics, wherein
the electrical output signal changes state when at least one of the first, second and fifth failure signals are generated.

11. The fail-safe switch of claim 10 wherein the first, second and fifth failure signals are independent of one another.

12. The fail-safe switch of claim 1, further including a fourth control path, the fourth control path having a fourth electrical circuit,
the fourth electrical circuit being configured to monitor predetermined characteristics of a logic power supply voltage,
the fourth electrical circuit generating a sixth failure signal when the characteristics of the logic power supply voltage monitored by the fourth electrical circuit are not in compliance with predetermined metrics, wherein
the electrical output signal changes state when at least one of the first, second and sixth failure signals are generated.

13. The fail-safe static switch of claim 12 wherein the first, second and sixth failure signals are independent of one another.

14. The fail-safe static switch of claim 1 wherein the signal analyzer is a digital signal processor.

15. A fail-safe static switch, comprising:
a first control path having a signal analyzer forming a first electrical circuit, the signal analyzer being configured to monitor predetermined characteristics of a power supply voltage, the signal analyzer generating a first failure signal when the characteristics of the power supply voltage monitored by the signal analyzer are not in compliance with predetermined metrics;
a second control path having a second electrical circuit, the second electrical circuit being configured to monitor predetermined characteristics of the power supply voltage, the second electrical circuit generating a fourth failure signal when the characteristics of the power supply voltage monitored by the second electrical circuit are not in compliance with predetermined metrics;
a third control path, the third control path having a third electrical circuit, the third electrical circuit being configured to monitor predetermined characteristics of the power supply voltage, the third electrical circuit generating a fifth failure signal when the characteristics of the power supply voltage monitored by the third electrical circuit are not in compliance with predetermined metrics;
a fourth control path, the fourth control path having a fourth electrical circuit, the fourth electrical circuit being configured to monitor predetermined characteristics of a logic power supply voltage, the fourth electrical circuit generating a sixth failure signal when the characteristics of the logic power supply voltage monitored by the fourth electrical circuit are not in compliance with predetermined metrics; and
an output providing an electrical output signal, wherein
the electrical output signal changes state when at least one of the first, fourth, fifth and sixth failure signals are generated.

16. The fail-safe static switch of claim 15 wherein the first, fourth, fifth and sixth failure signals are independent of one another.

* * * * *